United States Patent [19]

Pirooz

[11] 3,802,892

[45] Apr. 9, 1974

[54] GLASSES SUITABLE FOR PRODUCTION OF COPPER-COATED GLASS-CERAMICS

[75] Inventor: Perry P. Pirooz, Toledo, Ohio

[73] Assignee: Owens-Illinois, Inc., Toledo, Ohio

[22] Filed: Feb. 23, 1971

[21] Appl. No.: 118,201

[52] U.S. Cl. .......................... 106/52, 29/569, 65/32, 65/33, 106/39.7, 106/39.8, 106/53, 106/54, 117/227, 161/196, 252/512

[51] Int. Cl. .......................... C03c 3/22, C03c 3/30

[58] Field of Search ............ 106/39 DV, 52, 53, 54, 106/39.6, 39.7, 39.8; 65/32, 33, 21; 252/300, 506, 512; 317/258; 29/569; 161/196

[56] References Cited

UNITED STATES PATENTS

| | | | |
|---|---|---|---|
| 3,528,828 | 9/1970 | Smith | 106/39 DV |
| 3,205,079 | 9/1965 | Stookey | 106/39 DV |
| 3,117,881 | 1/1964 | Henry et al. | 106/39 DV |
| 3,240,661 | 3/1966 | Babcock | 65/33 |
| 2,972,543 | 2/1961 | Beals et al. | 106/48 |
| 3,586,521 | 6/1971 | Duke | 106/39.8 |
| 3,464,806 | 9/1969 | Seki et al. | 65/32 |
| 3,420,645 | 1/1969 | Hair | 65/21 |
| 2,920,971 | 1/1960 | Stookey | 106/39 DV |
| 3,557,576 | 1/1971 | Baum | 65/33 |
| 3,231,456 | 1/1966 | McMillan et al. | 106/52 X |
| 2,733,158 | 1/1956 | Tiede | 106/52 X |
| 3,490,887 | 1/1970 | Herczog et al. | 65/33 |

*Primary Examiner*—Helen M. McCarthy
*Attorney, Agent, or Firm*—Charles S. Lynch; E. J. Holler

[57] ABSTRACT

Provided are three distinct crystallizable copper-bearing alumina-silicate glass compositions. When heat treated during or subsequent to crystallization in an oxidizing atmosphere a copper oxide layer is formed upon the surface of the glass. Subsequent reduction of this layer to a metallic copper results in a strongly adherent film of copper upon a glass-ceramic substrate which may be further processed for use in microelectronic devices and printed circuit boards. The compositions, either crystallized or in vitreous state, are easily drilled using ultrasonic techniques. When such holes are formed prior to heat treatment, subsequent oxidation and reduction results in the copper film extending through the holes, thus providing a conductive lead from one side of the ceramic substrate to the other.

7 Claims, No Drawings

GLASSES SUITABLE FOR PRODUCTION OF COPPER-COATED GLASS-CERAMICS

This application relates to crystallizable glass compositions and methods of using same. More particularly, this invention relates to glass compositions capable of forming, in situ thereupon, a copper layer useful in the microelectronic and printed circuitry art.

Patterns of conductor metals, such as copper, have long been used in the microelectronic and printed circuit arts such as for making multilead conductor patterns in integrated circuitry packages or for making printed circuit boards. Generally speaking, such patterns are formed by, at least initially, providing a separate layer of the conductor metal upon a separate substrate and thereafter attempting to adhere the two layers together. While somewhat successful, a major problem in the art has been to obtain a substrate material which is sufficiently compatible with the known conductor materials to provide good adhesion without unduly sacrificing other necessary mechanical and electrical properties. That is to say, while several materials have been developed which are compatible with conductor materials, they generally sacrifice other mechanical (e.g. high temperature strength) and electrical properties in order to attain compatibility. On the other hand, other materials have achieved mechanical properties and electrical properties but they are usually achieved only at the expense of compatibility and the ability to obtain adhesion especially under humid or high temperature conditions.

One approach for solving this problem has been to develop a glass ceramic substrate, which upon selected heat treatment will cause conductor metal ions within its composition to migrate to its surface. This in situ conductor surface layer formation with ceramics of requisite expansions generally achieve good adhesion and high temperature strength characteristics. Such an approach is exemplified by U.S. Pat. No. 3,231,456. In this patent two specific types of copper-bearing, phosphorus pentoxide nucleated glasses are heat treated first in an oxidizing atmosphere under closely controlled conditions to crystallize the glass and to cause migration of copper ions to the surface of the glass-ceramic so formed. Thereafter, the glass-ceramic is heat treated under tightly controlled conditions in a reducing atmosphere to form a conductive copper film on the surface. Such a copper film is coated with a thin siliceous insulating layer and before use as a conductive device, the siliceous layer must be removed as for example with an HF etch. While achieving, generally speaking, good adhesion due to in situ copper migration, the need for an HF etch adds additional expense to the process. Furthermore, and as will be more fully illustrated hereinafter, the film was essentially nonconductive.

U.S. Pat. No. 3,490,887 also discloses the ability of copper ions to migrate to the surface of a glass ferroelectric material and form, after heat treatment in a reducing atmosphere, a metallic copper conductive coating thereupon. This patent, of course, deals with ferroelectric materials generally of the rather exotic barium titinate and niobate type, which materials are difficult to make under the best of controlled heat-treatments. Furthermore, because of the difficulty of forming large structures from these and other ferroelectrics and because of other factors such as cost of materials, etc., such materials are generally not suitable for use as microelectronic substrates or printed circuit boards.

In view of the above, it is apparent that there exists a definite need in the art for new glass compositions which can be used in the microelectronic and printed circuit arts to overcome the stated problems experienced therein.

Generally speaking, this invention fulfills this need in the art by providing certain copper-bearing crystallizable glass compositions of the alumina-silicate type which are capable of mechanically and electronically performing as substrates in the microelectronic and/or printed circuitry art and which are capable of forming, in situ during heat treatment, a tightly adhered conductive copper surface layer not overcoated with a siliceous insultating layer. As another aspect of this invention there is provided a process of using these glass compositions to form substrates having holes therein which are insitu copper coated to electronically connect selected portions of different sides of the substrate. Such a process finds unique applicability in forming substrates for "flip chip" or beam lead integrated circuit packages as more fully described hereinafter.

The copper-bearing crystallizable glass compositions contemplated by this invention are alumina-silicates generally classifiable into three types as follows:

TYPE I

| Constituent | Approx. Wt. % |
|---|---|
| $SiO_2$ | 25–35 |
| $Al_2O_3$ | 5–13 |
| CaO | 3–9 |
| MgO | 0–7 |
| $Na_2O$ | 10–20 |
| $K_2O$ | 0–10 |
| $Na_2O + K_2O$ | 15–25 |
| $TiO_2$ | 15–25 |
| $ZrO_2$ | 0–5 |
| CuO | 3–7 |
| BaO | 0–5 |

Preferably, at least about 90% by weight of the composition is made up of $SiO_2$, $Al_2O_3$, CaO, $Na_2O$, $TiO_2$, CuO, and $K_2O$ if present. A particularly preferred glass composition of Type I consists of:

Glass Composition A

| Constituent | Approx. Wt. % |
|---|---|
| $SiO_2$ | 30 |
| $Al_2O_3$ | 10 |
| MgO | 4 |
| CaO | 6 |
| BaO | 2 |
| $ZrO_2$ | 3 |
| $TiO_2$ | 20 |
| CuO | 5 |
| $Na_2O$ | 15 |
| $K_2O$ | 5 |

Properties of Product (Cu layer = about 1–3 mils thick)

| | |
|---|---|
| Coeff. of Exp. ($\times 10^{-7}$ cm/cm/°C 0–300°C) | |
| glass | 110 |
| glass-ceramic | 128 |
| sheet resistance (ohms/sq.) | 0.028 |
| solderability | excellent |
| adhesion (stand. pull test lbs. pull 0.1 in pad) | 7.6 |
| dielectric constant (K) | 21.3 |
| dissipation factor (D) % | 19.2 |
| loss factor (K × D) | 4.1 |
| pred. cryst. phase = | NaCa silicate |

TYPE II

| Constituent | Approx. Wt. % |
|---|---|
| $SiO_2$ | 40–50 |
| $Al_2O_3$ | 15–25 |
| $Na_2O$ | 10–20 |
| $K_2O$ | 0–5 |
| $Na_2O + K_2O$ | 15–20 |
| $TiO_2$ | 10–15 |
| CuO | 3–7 |
| Other compatible oxides | 0–10 |

Examples of other compatible oxides include PbO, $B_2O_3$, $Li_2O$, SnO, MgO, $ZrO_2$, CaO, BaO, and the like. Preferably, however, no other oxides are employed. A particularly preferred glass of Type II consists of:

Glass Composition B

| Constituent | Approx. Wt. % |
|---|---|
| $SiO_2$ | 45.4 |
| $Al_2O_3$ | 20.6 |
| $TiO_2$ | 12.5 |
| CuO | 5.0 |
| $Na_2O$ | 16.5 |

Properties of Product (Cu layer = about 1–3 mils thick)

| | |
|---|---|
| Coeff. of exp. (× $10^{-7}$ cm/cm/°C, 0–300°C) | |
| glass | 92 |
| glass ceramic | 110 |
| sheet resistance (ohms/sq.) | 0.022 |
| solderability | good |
| adhesion (stand. pull test, lbs. 0.1 inch pad) | 3.2 |
| dielectric constant (K) | 8 |
| dissipation factor (D) % | 10.9 |
| loss factor (K × D) | 0.87 |
| predom. cryst. phase = | NaAl silicate |

TYPE III

| Constituent | Approx. Wt. % |
|---|---|
| $SiO_2$ | 40–50 |
| $Al_2O_3$ | 20–30 |
| $TiO_2$ | 1–10 |
| CuO | 3–7 |
| MgO | 5–8 |
| $ZrO_2$ | 0–8 |
| $TiO_2 + ZrO_2$ | at least about 6% |
| Compatible oxides | 0–10 |

Examples of compatible oxides include $Li_2O$, PbO, $B_2O_3$, BaO, SnO, etc., well known in the art. A particularly preferred glass composition of Type III consists of:

Glass Composition C

| Constituent | Approx. Wt. % |
|---|---|
| $SiO_2$ | 43.5 |
| $Al_2O_3$ | 28.5 |
| $Li_2O$ | 0.6 |
| MgO | 6.6 |
| BaO | 3.8 |
| $ZrO_2$ | 6.6 |
| $TiO_2$ | 1.7 |
| CuO | 5.0 |
| PbO | 1.9 |
| $B_2O_3$ | 1.0 |
| $F_2$ | 0.9 |

Properties of Product (Cu layer = about 1–3 mils thick)

Glass Composition C-Continued

| Constituent | | Approx. Wt. % |
|---|---|---|
| | Coeff. of exp. (× $10^{-7}$ cm/cm/°C) | |
| 35 | glass | |
| 73 | glass ceramic | |
| 0.146 | sheet resistance (ohms/sq.) | |
| OK | solderability | |
| 3–6 | adhesion (stand. pull test, lbs., 0.1" pad) | |
| 6.7 | dielectric constant (K) | |
| 0.86 | dissipation factor (D) % | |
| 0.057 | loss factor (K × D) | |
| | Predominant crystalline phase = | high quartz solid |
| sol. | | |

The glass compositions of this invention may be melted from conventional batch ingredients and formed into desired shapes using standard techniques.

As alluded to hereinabove, the glass compositions of this invention in shaped-glass form are readily converted into copper layer bearing glass ceramics by subjecting them to a heat treatment. In a preferred technique, the first step in the heat-treatment is to subject the glass structure to an oxidizing atmosphere (e.g. air, oxygen, or mixtures thereof) at a sufficient temperature and time to cause migration of copper ions to the surface to form a significant layer of CuO thereon. Such a treatment may be effected after crystallization or be used to simultaneously effect crystallization of the object. Thereafter, the glass-ceramic structure is subjected to a reducing atmosphere or environment at a temperature usually lower than that of the first heat-treatment and for a sufficient period of time to reduce the CuO to a conductive layer of metallic copper.

As stated this two-step heat treatment is preferred because it appears to optimize the quality of the layer so formed. This is not to say, however, that it is critical. Actually a one-step heat treatment may be used wherein crystallization, ion migration, and reduction are all carried out in a reducing atmosphere. Such a one-step technique usually is conducted at a higher temperature than the reducing step of the two-step technique in order to insure that crystallization takes place. Generally speaking, this one-step technique usually results in a thinner, more porous film of metallic copper. In those instances where such a layer is tolerable, economics may render this one-step technique more desirable.

Different times and temperatures for the heat treatments are preferably employed for each type of glass. In those instances where the geometrical tolerances are critical it is often preferred to precrystallize the glass prior to the cutting and grinding operations of the parts in order to avoid the rather inaccurate necessity of estimating shrinkage during crystallization and/or encountering camber. In those instances, however, where precise substrate dimensions are not required it is most convenient for economic purposes etc., to combine the crystallization and oxidizing heat-treatments.

Typical and preferred heat-treatment schedules for each of the three types of glasses contemplated by this invention are as follows (assuming conventional substrates of standard thicknesses):

TYPE I

1. Oxidation heat treatment — heat in air, oxygen, or synthetic mixtures thereof at about 750°–850°C, preferably about 800°C, for 4–20 hours, preferably 16 hours.

2. Reduction heat treatment — heat in a reducing environment, preferably a gaseous environment containing at least about ½% $H_2$ and most preferably a forming gas environment (90% $N_2$ – 10% $H_2$) at about 450°–600°C (preferably about 500°C) for about 5–60 minutes (preferably about 15 minutes).

Type II

1. Oxidation heat treatment — same as type I above except at about 800°–900°C (pref. 825°C) for 4–24 hours (preferably 16 hours).

2. Reduction heat treatment — same as type I.

TYPE III

1. Oxidation heat treatment — same as type I above except at about 800°–900°C (preferably 825°C) for 16–64 hours (preferably 24 hours).

2. Reduction heat treatment — same as type I.

In all of the above heat-treatments, the vitreous glass will be inherently crystallized during the oxidizing heat treatment step. If precrystallization is desired, the oxidizing heat treatment times and temperatures may be employed first to precrystallize and then in an additional step after cutting, grinding, and the like to effect the generation of the CuO coating.

Once the compositions of this invention have been formed into a substrate containing a tightly adherent copper in situ coating thereupon, it may be used directly in a wide variety of environments within the microelectronic and printed circuit art. Since no insulating siliceous layer coats the metallic copper layer upon its formation no acid etching as per the prior art is necessary. In addition, the coating formed is of such a good quality copper that excellent solderability with conventional conductor leads (e.g. Kovar) is obtained.

The various properties of products formed from preferred specific compositions are given hereinabove. From this data, there may be derived several generalizing characteristics for each of the three types of glasses contemplated by this invention. Firstly, the compositions of Type I, and particularly composition A, form products which exhibit excellent conductor characteristics, both mechanical and electrical. On the other hand their dielectric characteristics are not as good as those of Types II and III. For this reason it is particularly preferred to use Type I compositions in those environments where high mechanical strengths and conduction are required but where the circuit is not being subjected to high frequencies and/or power densities.

One particular area in which Type I compositions find particularly suitable use is in the "flip chip" package for integrated circuits. Heretofore such a package had to be produced by soldering a lead frame to the conductor leads on the same side of the substrate having the silicon integrated circuit "flip chip" located thereon. Now, because of the ability to easily form an electronically conductive hole or via from one side of the substrate to the other, the frame may be more conveniently connected to the side of the substrate opposite that of the silicon chip. A typical technique for producing such a package in accordance with this invention is to:

a. form the desired shaped substrate having a Cu coating thereupon as per the above using any of the three types of glasses, but most preferably of Type I, the substrate having Cu coated holes strategically located therein, b. form the desired conductor pattern, preferably by standard photoetch techniques in the Cu layer, c. mount the "flip chip" integrated circuit upon the conductor pattern and mount a lead frame so as to connect the leads to their corresponding conductor areas on the other side of the substrate, d. solder and seal both the lead frame and chip to the substrate, and e. package the entire component in plastic as per conventional techniques.

As stated, Type I compositions are preferred in this "flip chip" embodiment since such packages are generally not called upon to carry or employ high frequencies and/or power densities. On the other hand, the packaging-in-plastic step by its nature tends to subject the sub-assembly to shock and other maltreatment. Because of the excellent mechanical strength of the various joints and bends formed when using compositions of Type I, high reliability and low numbers of rejects are obtained despite this mal-treatment.

While Types II and III may also be used in the "flip chip" package, they generally exhibit lower conductor characteristics (both mechanical and electrical) than does Type I and thus are less desirable to use. On the other hand, Types II and III generally exhibit significantly better dielectric properties such as lower dielectric constants, lower dissipation factors, and lower loss factors than Type I. These two types of glass compositions are therefore usually most preferably employed where high conductor characteristics are of secondary importance to dielectric characteristics. One example of such an environment is a printed circuit board which must carry or employ high frequencies and/or high power densities. Generally speaking Type I compositions are less desirable to use as frequencies approach the microwave range and/or power densities approach about 100 watts/in.$_2$. From the point of view of a comparison between Types II and III, Type II is intermediate between Types I and III in both conductor characteristics and dielectric properties. Thus this invention provides a spectrum of compositions for use throughout the many environments of the microelectronic and printed circuit art.

The following examples are presented by way of illustration and not limitation.

EXAMPLE I

The following batch ingredients were blended and heated to 2,300°F for 22 hours in an electric furnace using a platinum crucible with continuous mechanical stirring in order to form a homogeneous glass of composition A above:

Batch

| Constituent | Parts by Wt. |
|---|---|
| Kesil Quartz | 1424.8 |
| Iwatani Alumina | 503.1 |
| calcium carbonate | 534.6 |
| magnesium carbonate | 205.2 |
| potassium carbonate | 368.1 |
| titanox F.M.A. | 1005.5 |
| Florida Zircon | 227.3 |
| barium carbonate | 129.1 |
| cupric oxide | 250.5 |
| sodium carbonate | 1282.3 |

The molten glass formed was cast into a preheated mold (650°F) and annealed at 940°F to obtain a billet 2 inches × 4 inches × 8 inches. This billet was then precrystallized by heating it in air at 800°C for 16 hours. The predominant crystalline phase was NaCa silicate. The billet was then sliced using a standard saw to obtain a substrate 1 inch × 2 inches × 0.025 inch. The Glass-ceramic was easily cut, and the cut surface, quite surprisingly, was so smooth that no grinding thereof was necessary. The sides of the substrate were then trimmed to provide precise dimensions for later use. Holes on the order of about 8–10 mils in diameter were then provided at selected locations through the 0.025 inch thick substrate using a Sheffield Cavitron (a conventional ultrasonic drill).

The so formed substrate was then heated in air at 800°C for 16 hours wherein after it was cooled to 500°C and the atmosphere was purged with nitrogen and then switched to forming gas (90% $N_2$ – 10% $H_2$). The substrate was then held for 15 minutes at 500°C in the forming gas whereupon a continuous even coating of copper of about 1–3 mils in thickness was formed. The holes were also found to be evenly coated and conductively connected the coated sides of the substrate. The properties of the coated substrate are those reported relative to the "Composition A" table hereinabove.

This substrate, so formed may now be used in a variety of environments, two examples of which are set forth as follows:

A. Flip-Chip Package

By providing the above described coated holes in the requisite pattern a flip chip integrated circuit package is manufactured as follows:

a. apply to the substrate a conventional photoresist composition to the copper coating, b. expose the photoresist through a mask to produce the requisite latent image for forming a conductor pattern of the copper coating, c. develop photoresist latent image with photoresist developer, d. etch, using a conventional etchant such as $FeCl_3$, to produce Cu conductor pattern, e. clean off masking compounds, f. separate large substrate into individual substrates by conventional methods, g. mount flip chip and attach assembly to the lead frame as described above, h. seal and solder components, and i. encapsulate sub-assembly in plastic to form package.

B. Printed Circuit Board

By providing a substrate as formed except using a billet of dimensions 2-½ inches × 2-½ inches × 6 inches a printed circuit board may be readily formed. Generally speaking, after slicing, the substrate is trimmed and ground using a 600 grit silicon carbide powder to obtain a very smooth surface and dimensions of about 2 × 2 × 1/16 inch. Holes are similarly provided as in A above, and photoetching as described is carried out to achieve the desired printed conductor pattern. The substrate is then conventionally mounted in the environment in which it is to be used.

EXAMPLE II

By way of comparison and in order to show the unique contribution which this invention makes to the art, the procedures of U.S. Pat. No. 3,231,456 were twice reproduced, each reproduction being by a different individual. The compositions reproduced for evaluation were Composition II and VIII from the table at the bottom of page 1 of this patent. Each reproduction started with a separately formulated batch to produce each of the recited compositions. The compositions so produced were chemically analyzed and found to be very close to the exact percentages reported in the table of the patent. For example, one of the reproductions analyzed as consisting of:

| Constituent | II Theoretical | Analyzed |
|---|---|---|
| $SiO_2$ | 63.7 | 63.9 |
| $Li_2O$ | 18.0 | 17.8 |
| $Al_2O_3$ | 10.9 | 10.9 |
| $P_2O_5$ | 4.4 | 4.1 |
| CuO | 2.0 | 1.9 |
| SnO | 1.0 | 0.96 |

The melting procedures employed were those outlined in column 4, lines 26–32 of the patent. The following table lists the melting procedure for both compositions:

| | |
|---|---|
| Size of melt | 500 gm. |
| Temperature | 2400°F |
| Time | 6 hrs. |
| Atmosphere | air |
| Crucible | $SiO_2$ |
| Furnace | electric |

Good glasses were obtained from both compositions. The following table lists the melting data:

| | II | VIII |
|---|---|---|
| seeds | none | none |
| devitrif. | none | none |
| homogeneity | good | good |
| color | light blue, transp. | light blue, transp. |
| surface | copper oxide film | copper oxide film |
| annealing | 480°C (1 hr.) | 480°C (1 hr.) |

Samples were cooled, after annealing, at a rate not exceeding 5°C/min.

Slices were cut from the slabs and ground to a smooth finish on one side with 600 grit grinding powder. Final sample dimensions were approximately, 1 inch × 1 inch × 1/16 inch. The samples were carefully cleaned with acetone before heat treatment.

The following heat-treatment cycle was employed. This heat-treatment is that described in column 4, lines 33–50 of the patent.

| Heat Treatment | Atmosphere |
|---|---|
| room temp. | $O_2$ |
| 5°C/min. rise | $O_2$ |
| 500°C/1 hr. | $O_2$ |
| 5°C/min. rise | $O_2$ |
| 600°C (1 hr.) | furnace purged with $N_2$ for 10 min. Then forming gas was started. |
| 5°C/min. rise | forming gas |
| 850°C (1 hr.) | forming gas |
| furnace rate cool | forming gas |
| room temperature | forming gas |

Both reproductions yielded substantially the same results. A film having the appearance of copper was present after heat treatment in both compositions. However, a check for conductivity with a Simpson voltohm-milliamp meter showed no conductivity. It was therefore assumed that a thin siliceous film covered the copper-colored film as claimed in the patent.

Example II was etched for 50 minutes in two precent hydrofluoric-acid as in the patent, column 4, lines 51 through 55. While a copper-colored film still remained, testing still showed no conductivity. In an attempt to remove more of the supposed siliceous layer, etching was continued with four per cent HF for another thirty minutes, but the surface was still not conductive. Example VIII was treated with a two per cent solution of hydrofluoric acid for 5 minutes according to the procedure outlined in column 5, lines 5 – 14 of the patent, and showed no conductivity at all, but it appeared that the colored film had been partially removed by the etchant.

The above comparison with the prior art amply evidences the valuable contribution presented by this invention. Once given the above disclosure many other features, modifications, and improvements will become apparent to the skilled artisan. Such other features, modifications, and improvements are thus considered to be a part of this invention the scope of which is to be determined by the following claims.

I claim:

1. A crystallizable glass composition capable of being crystallized to a glass ceramic body which when heated in a reducing atmosphere will form an in situ metallic copper coating upon its surface, said glass composition being selected from a composition consisting essentially of by weight per cent about:

A. 25–35% $SiO_2$, 5–13% $Al_2O_3$, 3–9% CaO, 0–7% MgO, 10–20% $Na_2O$, 0–10% $K_2O$, 15–25% $Na_2O + K_2O$, 15–25% $TiO_2$, 0–5% $ZrO_2$, 3–7% CuO, and 0–5% BaO; (B) 40–50% $SiO_2$, 15–25% $Al_2O_3$, 10–20% $Na_2O$, 0–5% $K_2O$, 15–20% $Na_2O + K_2O$, 10–15% $TiO_2$ and 3–7% CuO; and (C) 40–50% $SiO_2$, 20–30% $Al_2O_3$, 1–10% $TiO_2$, 3–7% CuO, 5–8% $ZrO_2$, and at least about 6% $TiO_2 + ZrO_2$.

2. A glass composition according to claim 1 wherein said composition is (A) wherein at least about 90% by weight of said composition is made up of $SiO_2$, $Al_2O_3$, CaO, $Na_2O$, $TiO_2$, $K_2O$, and CuO.

3. A glass composition according to claim 1 wherein said composition is (B) and wherein said composition contains no more than about 10% by weight of other compatible oxides.

4. A glass composition according to claim 1 wherein said composition is (C) and wherein said composition contains no more than about 10% by weight of other compatible oxides.

5. A glass composition according to claim 1 which consists essentially of by weight, about 30% $SiO_2$, 10% $Al_2O_3$, 4% MgO, 6% CaO, 2% BaO, 3% $ZrO_2$, 20% $TiO_2$, 5% CuO, 15% $Na_2O$, and 5% $K_2O$.

6. A glass composition according to claim 1 which consists essentially of by weight, about: 45% $SiO_2$, 21% $Al_2O_3$, 12.5% $TiO_2$, 5% CuO, and 16.5% $Na_2O$.

7. A glass composition according to claim 1 which consists essentially of by weight, about: 43.5% $SiO_2$, 28.5% $Al_2O_3$, 0.6% $Li_2O$, 6.6% MgO, 3.8% BaO, 6.6% $ZrO_2$, 1.7% $TiO_2$, 5.0% CuO, 1.9% PbO, 1.0% $B_2O_3$ and 0.9% $F_2$.

* * * * *

PO-1050
(5/69)

UNITED STATES PATENT OFFICE
CERTIFICATE OF CORRECTION

Patent No. 3,802,892 Dated April 9, 1974

Inventor(s) Perry P. Pirooz

It is certified that error appears in the above-identified patent and that said Letters Patent are hereby corrected as shown below:

Col. 2, line 16, "insultating" should be ---insulating---.
Col. 6, line 37 "$in._2$" should be ---$in.^2$---; Col. 6, line 66, after the word "glass" insert ---so---.
Col. 7, line 4, after the word "standard" insert ---diamond---.
Col. 9, line 4, "precent" should be ---percent---.
Col. 10, Claim 1, line 7, "5-8% $ZrO_2$" should read ---5-8% MgO, 0-8% $ZrO_2$---.

Signed and sealed this 31st day of December 1974.

(SEAL)
Attest:

McCOY M. GIBSON JR.
Attesting Officer

C. MARSHALL DANN
Commissioner of Patents